United States Patent [19]
Wolaver

[11] Patent Number: 4,587,496
[45] Date of Patent: May 6, 1986

[54] FAST ACQUISITION PHASE-LOCK LOOP

[75] Inventor: Dan H. Wolaver, Worcester, Mass.

[73] Assignee: General Signal Corporation, Stamford, Conn.

[21] Appl. No.: 649,677

[22] Filed: Sep. 12, 1984

[51] Int. Cl.$^4$ .......................... H03L 7/10; H03D 13/00
[52] U.S. Cl. ..................................... 331/1 A; 307/526; 328/133; 331/11; 331/17; 331/27
[58] Field of Search ...................... 331/1 A, 10, 11, 12, 331/17, 25, 27; 307/525, 526; 328/133, 134

[56] References Cited

U.S. PATENT DOCUMENTS

| | | | |
|---|---|---|---|
| 3,472,960 | 10/1969 | Gutleber et al. | 178/67 |
| 4,015,083 | 3/1977 | Bellisio | 178/69.1 |
| 4,128,811 | 12/1978 | Englund, Jr. | 331/11 X |
| 4,215,430 | 7/1980 | Johnson, Jr. | 375/111 |
| 4,267,514 | 5/1981 | Kimsey | 328/133 |
| 4,510,461 | 4/1985 | Dickes et al. | 331/27 X |

OTHER PUBLICATIONS

Rae et al., "Variable Frequency Oscillator Using a Frequency Discriminator", IBM Technical Disclosure Bulletin, vol. 27, No. 1A, Jun. 1984, pp. 355-357.
"Generalized Phase Comparators for Improved Phase-Locked Loop Acquisition"; James F. Oberst, IEEE Trans. on Comm. Tech. V COM-19, pp. 1142-1148, Dec. 1971.
"Frequency Detectors for PLL Acquisition in Timing and Carrier Recovery", D. G. Messerschmitt, IEEE Trans. Comm. v COM-27 v 9, Sep. 1979, pp. 1288-1295.

Primary Examiner—Siegfried H. Grimm
Attorney, Agent, or Firm—Barnes & Thornburg

[57] ABSTRACT

A PLL frequency detector or comparator is provided having an up-down counter, responsive to beat signals produced by the input periodic waveforms of the VCO reference signals and the input data signals, to produce top and bottom output signals which enable multivibrators connected to each of the input signal lines to transmit overflow and underflow output pulses, whose sum is proportional to the difference in frequency of the input signals up to a predetermined maximum level, as control signals for the PLL loop filter. The up-down counter may include three or more states with buffer states which prevent generation of overflow or underflow output signals when the PLL is within a predetermined region of phase-lock and the sign of the beat signal oscillates. The up-down counter may also be employed simultaneously as a phase detector or comparator, wherein the top and bottom output signals are combined so as to produce control signals for the PLL loop filter when the overflow and underflow output signals are not generated.

12 Claims, 12 Drawing Figures

PROIR ART

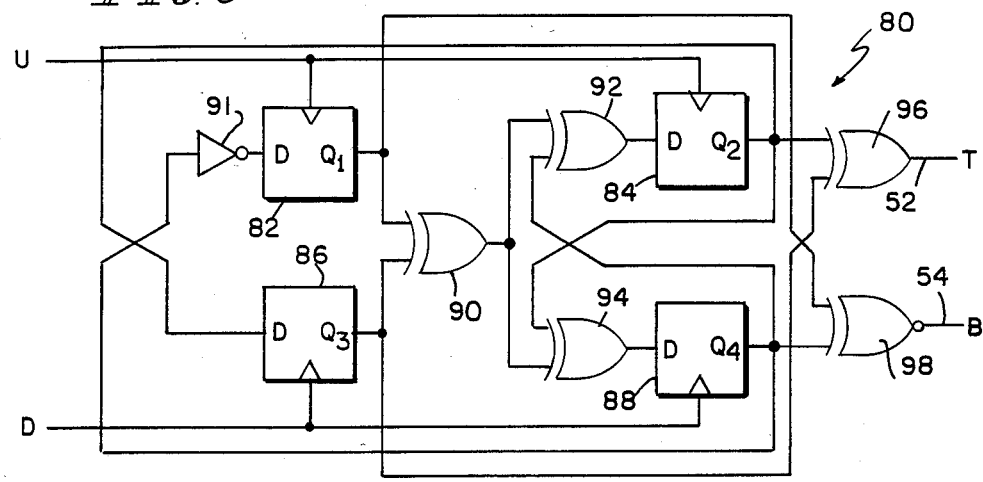
FIG. 9
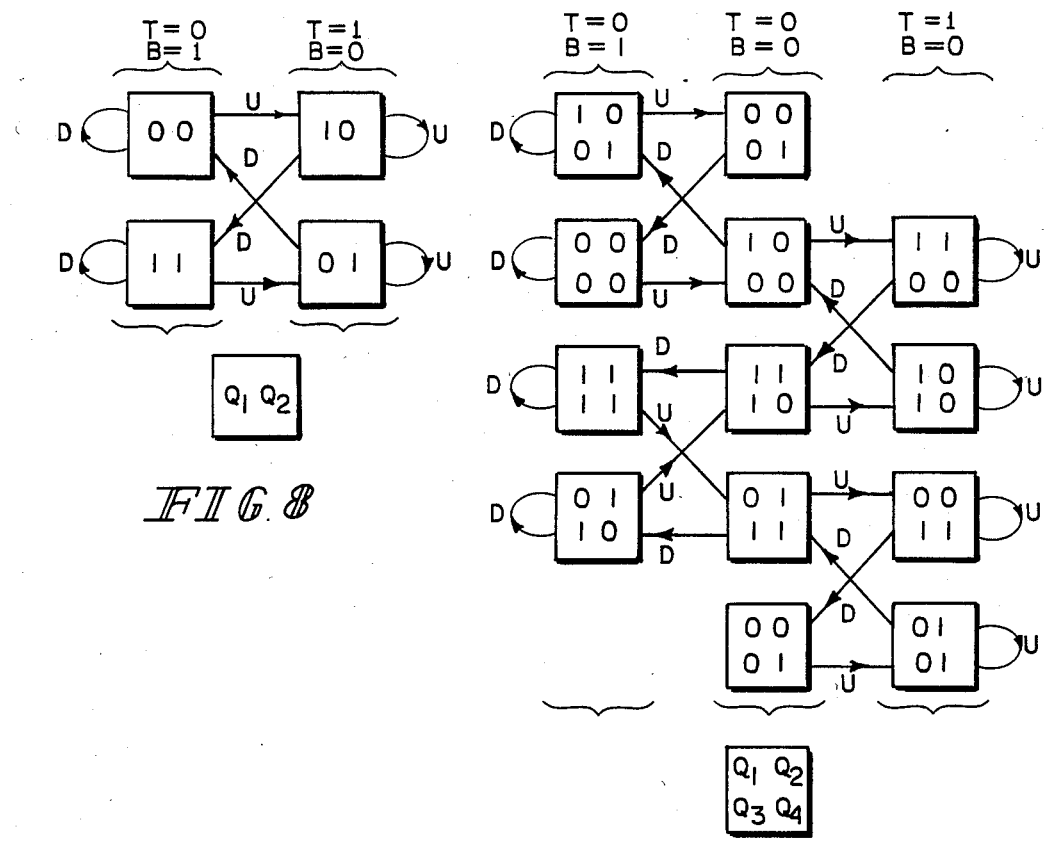
FIG. 8
FIG. 10

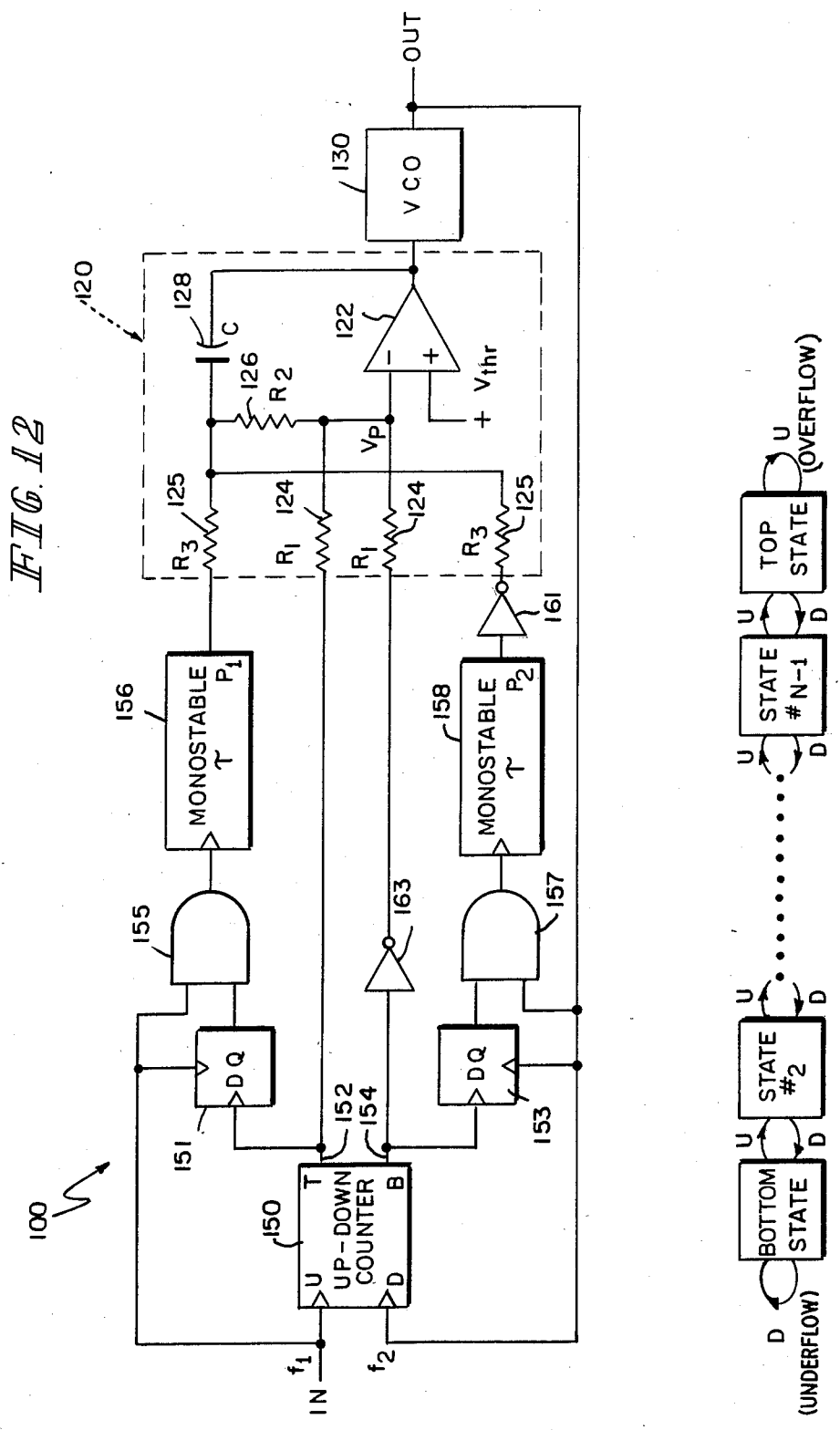

FAST ACQUISITION PHASE-LOCK LOOP

BACKGROUND AND SUMMARY OF THE INVENTION

The present invention relates generally to phase-lock loop circuits and, more particularly, to such circuits having frequency detectors for fast lock acquisition.

Phase lock loops (hereinafter referred to as "PLLs") are often employed with data communications equipment such as frequency and signal synthesizers and jitter measurement circuits. With PLLs having narrow, flat gain bandwidths on the order of 1 Hz, stability constraints result in a lock acquisition time for phase-lock which can be several seconds. In present high speed circuits, this represents a considerable delay.

Second order phase-lock loops typically include frequency detector or comparator means to assist in acquiring lock when an extended range of input data signal frequencies is expected. Such a conventional PLL circuit is shown in block diagram form in FIG. 1. Frequency detector 10 and phase detector 15 each receive frequency signals $f_1$ and $f_2$. Frequency $f_1$ is of the system input data signal and $f_2$ is of the reference signal generated by voltage controlled oscillator (hereinafter referred to as "VCO") 30. Frequency detector 10 and phase detector 15 may be referred to generally as the PLL input stage and serve to compare the frequency and phase of signals $f_1$ and $f_2$, respectively. The frequency and phase difference between these signals is used to generate error signals $V_f$ and $V_d$, respectively, which are fed back to VCO 30 through loop filter 20 to control the frequency $f_2$ so as to reduce the phase and frequency difference with respect to $f_1$. As will be readily understood by those skilled in the art, frequency detector 10 provides a coarse tuning of VCO 30, and phase detector 15 provides a fine tuning of VCO 30.

Frequency synthesizers and jitter measurement circuits often employ a PLL having a bandwidth on the order of 1 Hz. Even with frequency detectors, the lock acquisition time for such conventional PLLs is typically greater than ten seconds. While such a long acquisition time is satisfactory for machine-only environments, it is desirable to reduce waiting time to fractions of a second when human operators are involved.

Lock acquisition time for PLLs is largely a function of the loop filter response to frequency and phase difference signals from the corresponding detector means. FIG. 2 shows a schematic diagram of a conventional loop filter 20 suitable for use in the PLL circuit of FIG. 1. Operational amplifier 22 has its positive terminal grounded, and input signal voltage $V_d$ from phase detector 15 connected to its negative terminal across resistor 24. Input signal voltage $V_f$ from frequency detector 10 is connected to capacitor 28 in the feedback loop across resistor 25 and to the negative terminal of operational amplifier 20 across resistors 25 and 26 in series. Loop filter 20 provides control voltage $V_c$ to VCO 30 to reset $f_2$ to match the system input signal $f_1$.

In order to acquire lock, capacitor 28 must be charged to a voltage that will set the VCO to the proper frequency. The frequency detector is primarily responsible for charging capacitor 28. For PLLs with a narrow bandwidth and wide input frequency range, capacitor 28 must be larger and, thus, it often takes a longer time to charge. It has been found that modifying the frequency detector will permit modification of this charging time.

Combined phase and frequency detectors in PLLs have been employed to aid in lock acquisition and have been realized through the use of up-down counters. The output voltage versus frequency characteristic of such devices when employed as a frequency detector in a PLL is shown graphically in FIG. 3. While a signal representing the sign of the frequency difference of the input data and clock signals is provided, such a device gives little or no indication of the magnitude of the difference in frequency. As a result, capacitor 28 is charged at a generally constant rate, and the acquisition time is proportional to the initial frequency difference detected. Mathematically, the relationship may be represented by:

$$T_p = 2\Delta f / (\pi^2 f_{BW}) \qquad \text{Eq. 1}$$

where $T_p$ is the acquisition time, $\Delta f$ is the initial detected frequency difference, and $f_{BW}$ is the PLL bandwidth.

$T_p$ can be reduced by amplifying frequency detector output signal $V_f$ to charge capacitor 28 sooner. It has been suggested alternatively (because of the different technologies involved) to achieve this by increasing the pulse rate of $V_f$ or by increasing the signal amplitude of $V_f$ as the frequency difference increases. However, if $V_f$ becomes too large when $f_1$ is approximately equal to $f_2$, the PLL will overshoot the lock region and become unstable. To make $V_f$ larger overall but small where $f_1 - f_2$ is approximately zero, $V_f$ should be made proportional to $f_1 - f_2$. Prior PLL devices, such as the quadricorrelator and the rotational frequency detector, have attempted to do this, but have only been successful within a relatively small frequency range. FIG. 4 shows graphically the output voltage versus frequency characteristics for these devices when employed as frequency detectors in a PLL.

As can be seen, $V_f$ is proportional to $f_1 - f_2$ only over a small frequency difference of approximately $\pm 25\%$. In this range the acquisition time can be expressed as:

$$T_p = (4\pi f_{BW})^{-1} \ln(\Delta f / 2\pi f_{BW}) \qquad \text{Eq. 2}$$

This logarithmic function of $\Delta f$ grows relatively slowly. For example, if $f_{BW} = 1$ Hz and $\Delta f = 50$ Hz, then $T_p = 0.17$ seconds. Under the same conditions, the frequency detector represented by Equation 1 would result in an acquisition time of ten seconds. If $\Delta f$ is increased to 100 Hz, the device of Equation 2 would have a $T_p$ of 0.22 seconds while the device of Equation 1 would have a $T_p$ of 20 seconds. Thus, such quadricorrelator devices perform satisfactorily if $\Delta f$ is approximately less than one quarter of $f_1$.

However, if $\Delta f$ becomes greater than $f_1/2$, quadricorrelator and rotational frequency detectors cannot be used in PLLs to effectively charge capacitor 28 and acquire phase-lock. Therefore, it is desirable to provide a frequency detector wherein $V_f$ is proportional to $f_1 - f_2$ over an extended range.

An object of the present invention is to provide a frequency comparator for phase-lock loop circuits having fast lock acquisition time.

Another object of the present invention is the provision of a frequency detector in a phase-lock loop circuit whose output voltage signal is proportional to the difference between the frequencies of its input signals over an extended frequency range.

A further object of the present invention is the provision of a combined phase and frequency comparator for a plurality of input periodic waveforms having fast lock acquisition time and increased loop stability.

These and other objects of the present invention are attained in the provision of a PLL frequency detector or comparator having an up-down counter, responsive to beat signals produced by the input periodic waveforms of the VCO reference signals and the input data signals, to produce top and bottom output signals which enable multivibrators connected to each of the input signal lines to transmit overflow and underflow output pulses, whose average is proportional to the difference in frequency of the input signals up to a predetermined maximum level, as control signals for the PLL loop filter. The up-down counter may also include three or more states with buffer states which prevent generation of overflow or underflow output signals when the PLL is within a predetermined region of phase-lock and the sign of the beat signal oscillates. The up-down counter may also be employed simultaneously as a phase detector or comparator, wherein the top and bottom output signals are combined so as to produce control signals for the PLL loop filter when the overflow and underflow output signals are not generated.

Other objects, advantages and novel features of the present invention will become apparent from the following detailed description of the invention when considered in conjunction with the accompanying drawings.

BRIEF DESCRIPTION OF THE DRAWINGS

FIG. 8 shows a state diagram for the counter of FIG. 7.

FIG. 9 shows a circuit diagram for another up-down counter suitable for use in the proportional frequency detector of FIG. 5.

FIG. 10 shows a state diagram for the counter of FIG. 9.

FIG. 11 shows a general state diagram for counters suitable for use in the proportional frequency detector of FIG. 5.

FIG. 12 shows a PLL circuit diagram including the proportional frequency detector of the present invention and further employing the up-down counter of that frequency detector in the phase detector according to the principles of the present invention.

DESCRIPTION OF THE PREFERRED EMBODIMENTS

Figure 1:
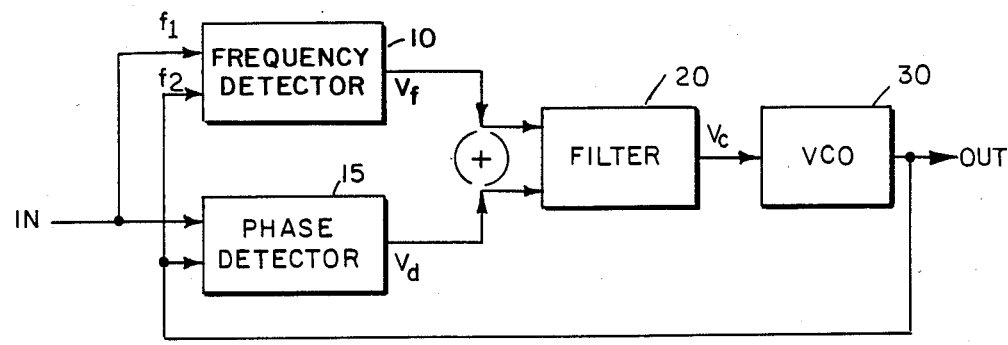
FIG. 1 shows, in block diagram form, a second order PLL circuit constructed according to prior teachings.

The especially preferred embodiments of the present invention to be described are employed in the conventional PLL circuit shown in FIG. 1 with the below described improvements and modifications.

Figure 2:
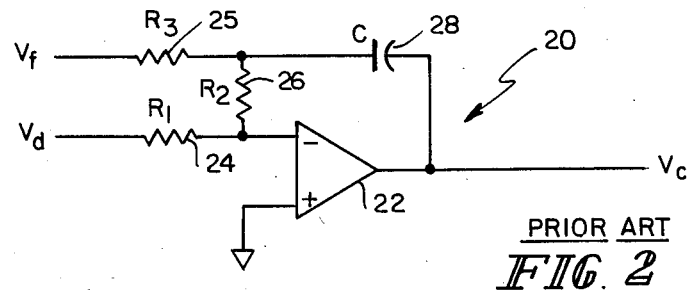
FIG. 2 shows, in a schematic diagram, a loop filter suitable for use in the PLL circuit of FIG. 1.
Figure 5:
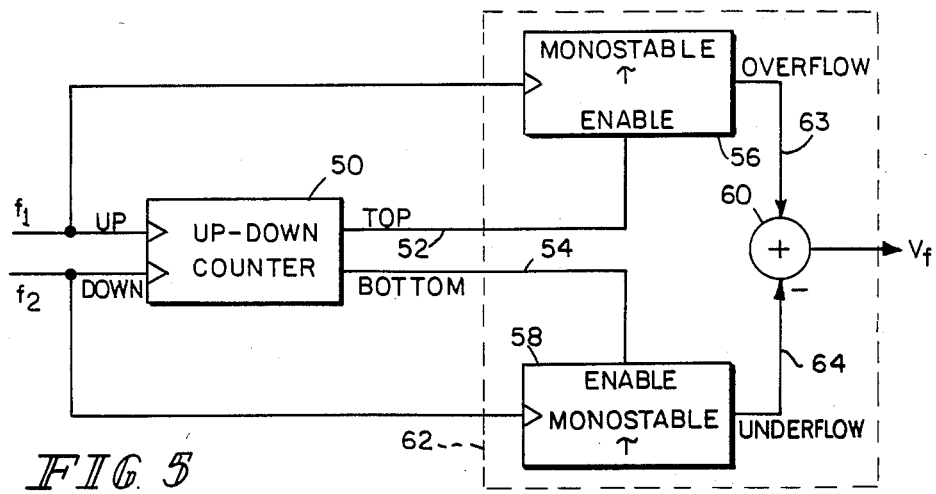
FIG. 5 shows, in block diagram form, a proportional frequency detector for use in a PLL according to the principles of the present invention.

FIG. 5 illustrates, in block diagram form, a preferred embodiment of a proportional frequency detector of the present invention. This proportional frequency detector includes an up-down counter 50 having circuit input data signals of frequency $f_1$, applied to its "Up" signal input and VCO-generated input reference signals of frequency $f_2$ applied to its down or "Dwn" signal input. The same circuit input data signals and reference signals applied to counter 50 as "Up" and "Dwn" inputs are also input to monostable multivibrators 56 and 58, respectively. "Top" output line 52 and "bottom" output line 54 from counter 50 provides enabling signals T and B to multivibrators 56 and 58, respectively. The outputs from multivibrators 56 and 58 are algebraically summed at 60 and provide control or input signals $V_f$ to loop filter 20 which charge capacitor 28 (shown in FIGS. 1 and 2, respectively).

Thus, counter 50 provides output signals at a rate which is a function of the difference between $f_1$ and $f_2$. When $f_1$ is greater than $f_2$, counter 50 produces output pulses along top output line 52. When $f_2$ is greater than $f_1$, counter 50 produces output pulses along bottom output line 54. These output pulses enable multivibrators 56 and 58 which are then triggered by the input signals having frequencies $f_1$ and $f_2$, respectively. To simplify the discussion below, input signals to multivibrator 56 will be referred to as "Up signals," and input signals to multivibrator 58 will be referred to as "Dwn signals." Thus, multivibrators 56 and 58 and summer 60 in combination function as an overflow and underflow transmission gate 62. Since the output pulses are, in the simplest case, produced at a rate proportional to $|f_1-f_2|$ and the multivibrators are enabled at this same rate, the output pulse rate from multivibrators 56 and 58 is also proportional to the difference between $f_1$ and $f_2$. Specifically, multivibrator 56 passes responsive pulses of input frequency $f_1$ at a rate of $f_1-f_2$ when $f_1$ is greater than $f_2$, but is not enabled when $f_2$ exceeds $f_1$. Likewise, multivibrator 58 passes responsive pulses of input frequency $f_2$ at a rate of $f_2-f_1$ when $f_2$ is greater than $f_1$, but is not enabled when $f_1$ exceeds $f_2$.

Multivibrators 56 and 58 produce output pulses of width $\tau$. These pulses are input to algebraic summer 60 and output therefrom as signals $V_f$. These output signals $V_f$ are inputs to loop filter 20 and represent, over time, the average of the multivibrator output pulses. It will be readily understood by those skilled in the art that negative values of $V_f$ result from the output pulses of multivibrator 58, when $f_2$ exceeds $f_1$. Since the multivibrator pulse rate is proportional to $|f_1-f_2|$, $V_f$ is also proportional to $f_1-f_2$, at least until the saturation level is reached. When $|f_1-f_2| > 1/\tau$, the multivibrator output pulses will overlap and, thus, $V_f$ cannot be increased. At this point $V_f$ is considered saturated. The saturation frequency is given by $f_{sat}=1/\tau$, and represents the highest frequency at which the given frequency detector produces a $V_f$ proportional to $f_1-f_2$.

Figure 6:
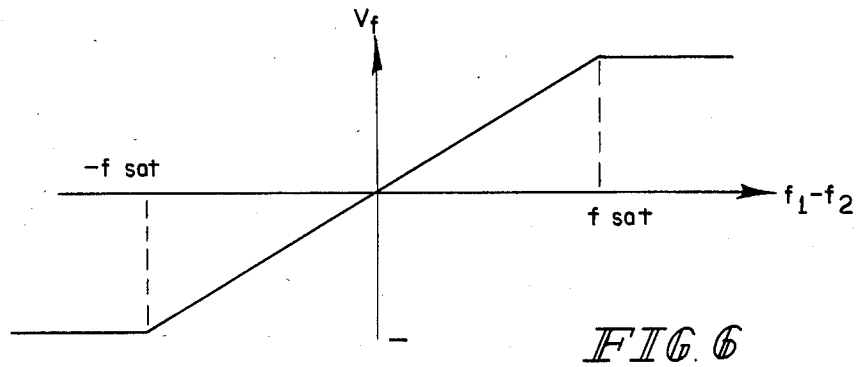
FIG. 6 shows graphically the output voltage versus frequency characteristics of the proportional frequency detector of FIG. 5.

FIG. 6 shows graphically the output voltage versus frequency characteristics ($V_f$ versus $f_1-f_2$) of the frequency detector illustrated in FIG. 5. As can be seen, the proportionality of $V_f$ with respect to the magnitude and polarity $f_1-f_2$ is extended until a predetermined $\pm f_{sat}$. After $\pm f_{sat}$ is reached, $V_f$ levels off to a fixed value.

Figure 3:
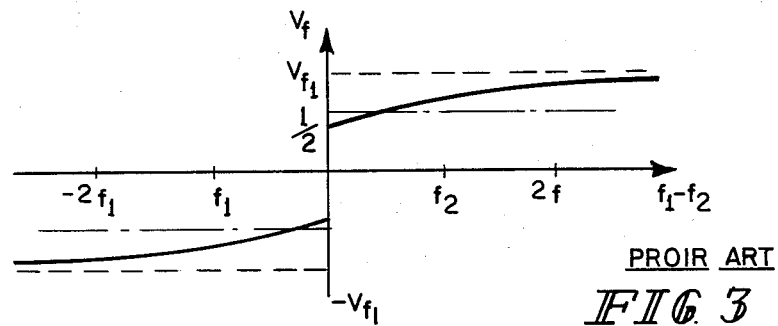
FIG. 3 shows graphically the output voltage versus frequency characteristics of prior combined phase and frequency detectors in a PLL.
Figure 4:
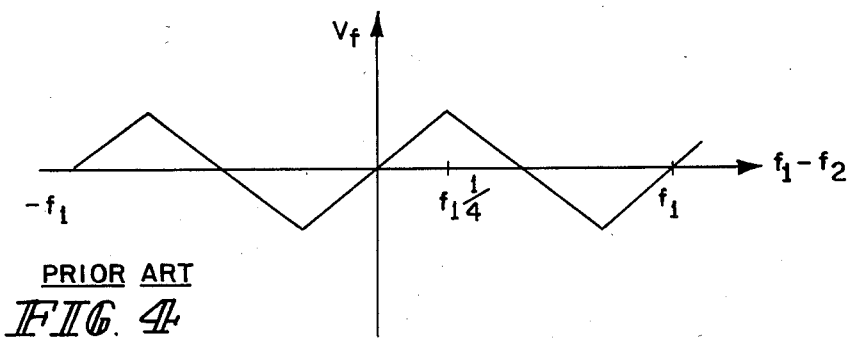
FIG. 4 shows graphically the output voltage versus frequency characteristics of prior quadricorrelator and rotational frequency detectors in a PLL.

A comparison of FIGS. 3 and 4 with FIG. 6 shows the dramatic improvement of the subject invention over prior PLLs. In particular, where $f_1-f_2$ is approximately zero, substantially linear proportionality is provided by the subject invention for either polarity or sign of $\Delta f$. This permits increased stability and shorter acquisition time, especially as compared with the PLL of FIG. 3. That prior device provides output signals indicative primarily of the polarity of $f_1-f_2$ as $\Delta f$ approaches zero. A quantum jump is made through zero as polarity changes. Thus, if $f_2$ approaches $f_1$ too quickly, that PLL has a tendency to become unstable as phase-lock is overshot.

As compared with the quadricorrelator device of FIG. 4, the subject invention provides a greatly extended effective range and avoids periodicity after $\pm f_1/4$. The PLL of the subject invention provides a substantially constant output beyond $\pm f_{sat}$. By careful selection of circuit elements determinative of $\tau$, $f_{sat}$ can be established at any desired level. This constant output may be established as the positve or negative maximum output, as shown in FIG. 6.

Both inputs to counter 50 of the frequency detector are periodic waveforms. Digital data and clock signals have been typically applied as such inputs in prior PLLs and, thus, a wide range has not been achievable. Further, counter 50 responds to beat signals produced every time the input signals pass through phase.

Figure 7:
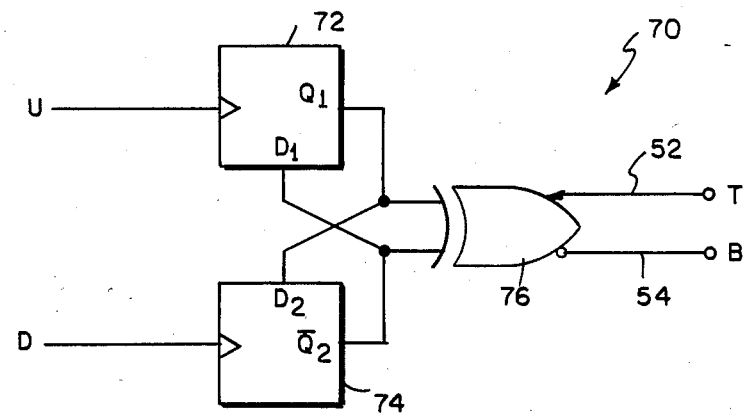
FIG. 7 shows a circuit diagram for an up-down counter suitable for use in the proportional frequency detector of FIG. 5.

FIG. 7 shows a circuit diagram for an up-down counter 70 suitable for use in the frequency detector of FIG. 5. Counter 70 includes D-type flip-flops 72 and 74 having data inputs $D_1$ and $D_2$ and outputs $Q_1$ and $Q_2$, respectively. Flip-flops 72 and 74 receive Up and Dwn input signals, respectively, as clock inputs. The outputs of both flip-flops are inputs to logic element 76 which produces an exclusive NOR output gate on top output line 52 and an exclusive OR output gate on bottom output line 54. Further, the output of flip-flop 72 from $Q_1$ is an input to flip-flop 74 at $D_2$, and the output of flip-flop 74 from $Q_2$ is an input to flip-flop 72 at $D_1$.

Briefly, counter 70 causes a signal T to be produced on top output line 52, but not on bottom output line 54, when the frequency of Up input signals exceeds that of Dwn input signals. Likewise, a signal B is produced on bottom output line 54, but not on top output line 52, when the frequency of Dwn input signals exceeds that of the Up input signals. As the Up and Dwn input signals pass through phase, the output signals change from one output line to another. A state diagram for two state up-down counter 70 is shown in FIG. 8.

FIG. 9 shows a circuit diagram for another up-down counter 80 suitable for use in the frequency detector of FIG. 5. Similar circuits may be found in commercially available counters such as Motorola MC4044 or MC12040. Counter 80 includes D-type flip-flops 82, 84, 86 and 88. Flip-flops 82 and 84 receive Up input signals as clock inputs, and flip-flops 86 and 88 receive Dwn input signals as clock inputs. The Q output of flip-flop 82 is applied as one of the two inputs of exclusive OR gate 90 and as one of the two inputs of exclusive NOR gate 98. The Q output of flip-flop 86 is applied as the other of the two inputs of exclusive OR gate 90 and as one of the two inputs of the exclusive OR gate 96. The output of exclusive OR gate 90 is applied as one of the two inputs to exclusive OR gate 92 and as one of the two inputs to exclusive OR gate 94. The output of exclusive OR gate 92 is the D input to flip-flop 84. The output of exclusive OR gate 94 is the D input to flip-flop 88. The Q output of flip-flop 84 is applied as the other of the two inputs to exclusive OR gate 96, as the other of the two inputs to exclusive OR gate 94 and as the D input to flip-flop 86. The Q output of flip-flop 88 is applied as the other of the two inputs to exclusive NOR gate 98, as the other of the two inputs to exclusive OR gate 92 and as the input to inverter 91. The output of inverter 91 is the D input to flip-flop 82. The output of exclusive OR gate 96 is applied to top output line 52. The output of exclusive NOR gate 98 is applied to bottom output line 54.

Briefly, as the operation of the counter 80 will now be readily understood by those skilled in the art, counter 80 is a three state counter which will cause an overflow signal to be produced on output line 63, but not on underflow output line 64, when counter 80 is already in its top state and the frequency of Up input signals continue to exceed the frequency of D input signals. Similarly, an underflow signal will be produced on underflow output line 64, but not on overflow output line 63, when counter 80 is already in its bottom state and the frequency of the Dwn input signals continues to exceed the frequency of the Up input signals. However, if the Up signal frequency does not continue to exceed the Dwn signal frequency when counter 80 is in its top state, or if the Dwn signal frequency does not continue to exceed the Up signal frequency when counter 80 is in its bottom state, or if counter 80 is in its middle or "buffer" state, then no signals will be output on either line 63 or line 64.

The state diagram for three-state up-down counters such as counter 80 is shown in FIG. 10. The presence of an internal buffer state allows the counter to be used as a phase detector with a range of $\pm 360$ degrees, as well as frequency detector.

The present invention contemplates that any number of buffer states may be employed as desired in a given up-down counter of a particular embodiment of the present invention. FIG. 11 shows a general state diagram for counters having N states with N−2 buffer states. By comparison, counter 70, as shown in FIG. 7, has no buffer state such that a signal T or B is always present at either output line 52 or 54, respectively.

In particular applications, either counter 70 or counter 80 will perform adequately in the proportional frequency detector of FIG. 5. However, often when incorporating a proportional frequency detector in the PLL of FIG. 1, considerable savings may be realized by using a single device for two functions. In particular, the up-down counter of the proportional frequency detector may also be employed within the phase detector. Such an arrangement is illustrated in FIG. 12. It has been found to be often preferable to use at least a three state counter for such dual function detector circuits because of its greater phase range as compared to up-down counters without buffer states.

FIG. 12 shows a PLL 100 having up-down counter 150 with circuit input data signals of frequency $f_1$ applied as Up signals to the counter's up input and reference signals of frequency $f_2$ applied as Dwn signals to the counter's down input. Counter 150 produces T and B output signals as a function of $(f_1-f_2)$ along top output line 152 and bottom output line 154, respectively, as described herein above.

In the frequency detector portion of PLL 100, the T signals are data inputs to D-type flip-flop 151 and the B signals are data inputs to D-type flip-flop 153. Flip-flop 151 receives Up signals as clock inputs and flip-flop 153 receives Dwn signals as clock inputs. The Q output of flip-flop 151 is received as an input by AND gate 155. The circuit input data signals, or Up signals, are applied to the other input of AND gate 155. The Q output of flip-flop 153 is received as an input by AND gate 157. VCO generated reference signals, or Dwn signals, are applied to the other input of AND gate 157. The output of AND gates 155 and 157 are received as clock inputs by monostable multivibrators 156 and 158, respectively. MC10198 is a commercially available device which may be adopted to provide each of the combination of elements 151, 155 and 156 and the combination of elements 153, 157 and 158. For example, to form the latter combination, B signals may be applied to the E+ enable input and Dwn signals applied to the trigger input of MC10198.

The signals output from multivibrator 158 are applied to inverter 161, and the output from that inverter is applied to resistor 125, having resistance value $R_3$, of loop filter 120. The signals output from multivibrator 156 are applied to another resistor 125, in parallel with the resistor receiving inverter 161 output signals and of the same $R_3$ value. The signals output from these resistors 125 are combined and applied as $V_f$ to capacitor 128 and, across resistor 126 of resistance value $R_2$, to the negative input of operational amplifier 122. Capacitor 128 is included in loop filter 120 and is connected across the feedback loop of operational amplifier 122.

The phase detector portion of PLL 100 includes counter 150 and inverter 163, providing T and B as inputs to loop filter 120. This inverter receives B signals as inputs and produces output signals to resistor 124, having resistance value $R_1$, of loop filter 120. T signals from counter 150 are applied to another resistor 124, in parallel with the resistor receiving inverter 163's output signals and of the same $R_1$ value. The output signals produced by these resistors 124 are both applied as $V_P$ to the negative input of operational amplifier 122. The positive input of that operational amplifier has a threshold voltage $V_{TH}$ applied thereto.

The output of loop filter 120 is applied to voltage controlled oscillator 130 to control the frequency $f_2$ of the reference signal applied to counter 150 and output from PLL 100. In general, the size of $R_3$ determines the strength of the frequency acquisition. In many embodiments, the PLL will overshoot and become unstable if $R_3$ is not greater than or equal to $(R_1\tau)/(2R_2C)$. $R_1$, $R_2$, and $\tau$ are as defined above. C is the capacitance value of capacitor 128. The acquisition time of Equation 2 is realized when this $R_3$ boundary is just met.

In summary, the present invention provides a proportional frequency detector for PLLs which permits significant decreases in acquisition time by quickly charging the loop filter capacitance. The pull-in time (or lock acquisition time) versus the range (or bandwidth) is a logarithmic relation. Thus, small increases in acquisition time permit great gains in pull-in range. However, at the same time that $V_f$ is made large enough to quickly charge the loop filter and achieve this fast pull-in, means are provided to prevent the PLL from jumping over the lock acquisition range. Further, the present invention provides circuits of increased versatility. The PLL cost may be significantly reduced since the frequency detector and phase detector circuits share components.

From the preceeding description of the preferred embodiments, it is evident that the objects of the invention are attained. Although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. In a phase-locked loop circuit receiving input signals and having means for generating reference signals, loop filter means for controlling said reference signal generating means, and an input stage to drive said loop filter means as a function of said input signals and said reference signals, the improvement being in said input stage and comprising:

up/down counter means for receiving said input signals and said reference signals and producing output signals, representative of the magnitude and polarity of the difference between the frequency of said input signals and the frequency of said reference signals, over an extended range greater than one-half of the frequency of said input signals, said up/down counter means including at least one internal buffer state for use in determining the phase difference between said input signals and said reference signals.

2. The phase-locked loop circuit of claim 1, wherein the output signal of said input stage is a signal whose magnitude is substantially linearly porportional to said magnitude of the difference between said frequencies.

3. In a phase-locked loop circuit receiving circuit input data signals and having means for generating reference signals, loop filter means for controlling said means for generating reference signals, and an input stage for driving said loop filter means, the improvement being in said input stage and comprising:

means for receiving as input signals said circuit input data signals and said reference signals and generating output signals along first and second signal paths according to the polarity of the difference in frequency between said circuit input data signals and said reference signals, said output signals along each of said first and second signal paths being proportional to the magnitude of said difference in frequency; and means for receiving said circuit input data signals, said reference signals, and said output signals from along said first and second signal paths, associating said circuit input data signals with said output signals from along said first signal path and said reference signals with said output signals from along said second signal path, and producing control signals to drive said loop filter means when both signals of either pair of said associated signals are present simultaneously, said control signals being proportional to said difference in frequency up to a predetermined level.

4. The phase-locked loop circuit of claim 3, wherein said means for generating output signals along first and second signal paths includes up/down counter means for producing top and bottom signals along said first and second signal paths, respectively, as a function of the positive and negative polarity, respectively, of said difference in frequency and at a rate proportional to the magnitude of said difference in frequency such that said top signals are associated with said circuit input data signals and said bottom signals are associated with said reference signals.

5. The phase-locked loop circuit of claim 4, wherein said up/down counter means prevents generation of said control signals when said difference in frequency is substantially zero.

6. The phase-locked loop circuit of claim 4, wherein said means for associating said circuit input data signals and said top signals and said means for associating said reference signals and said bottom signals each includes monostable multivibrator means triggered by one of said pair of associated signals and enabled by the other of said pair of associated signals.

7. The phase-locked loop circuit of claim 4, wherein said control signals include overflow and underflow signals each responsive to one of said pair of associated signals, and said up/down counter means further produces second top and second bottom signals as a function of the difference in phase between said circuit input data signals and said reference signals, and including means for applying said second top and second bottom signals as second control signals to drive said loop filter means.

8. The phase-locked loop circuit of claim 7, wherein said up/down counter means includes means for preventing generation of either of said overflow or underflow signals, but not said second top or second bottom signals, when said difference in frequency is substantially zero.

9. A proportional frequency detector, for use in phase-locked loop circuits having means for generating reference signals, loop filter means for controlling said means for generating reference signals, and input stage means for driving said loop filter means, comprising:
means for receiving input data signals and said reference signals, comparing the frequencies of these two signals, and producing output signals representative of the magnitude and polarity of the difference between said frequencies of these two signals; and
means for receiving said output signals and producing, as a function of said input data signals and said reference signals, control signals for driving said loop filter means, said control signals being proportional to the magnitude of the difference between said frequencies of these two signals up to a predetermined level and being fixed maximum values when said predetermined level is exceeded.

10. The proportional frequency detector of claim 9, wherein means are provided for preventing the generation of said control signals when the magnitude of said difference between said frequencies is substantially zero.

11. A proportional frequency detector, for use in phase-locked loop circuits, comprising:
up/down counter means for receiving input data signals and reference signals and producing top and bottom output signals representing the polarity and magnitude of the frequency difference between these two received signals;
overflow means for receiving said input data signals and said top output signals and producing overflow output signals when the frequency of said input data signals exceeds the frequency of said reference signals;
underflow means for receiving said reference signals and said bottom output signals and producing underflow output signals when the frequency of said reference signals exceeds the frequency of said input data signals; and
means for summing said overflow output signals and said underflow output signals and producing a combined output signal proportional to the polarity and magnitude of said frequency difference up to a predetermined saturation level.

12. The proportional frequency detector of claim 11, wherein said overflow and underflow means produce output signals of predeterminable, fixed pulse widths, and said predetermined saturation level is a function of those pulse widths.

* * * * *